United States Patent
Ishikawa et al.

(10) Patent No.: US 9,225,295 B2
(45) Date of Patent: Dec. 29, 2015

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventors: Hiroyoshi Ishikawa, Yokohama (JP); Satoshi Matsubara, Kawasaki (JP); Hideharu Shako, Yokohama (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 13/869,551

(22) Filed: Apr. 24, 2013

(65) Prior Publication Data

US 2013/0321078 A1   Dec. 5, 2013

(30) Foreign Application Priority Data

May 30, 2012 (JP) ................................ 2012-123723

(51) Int. Cl.
*H03F 1/26* (2006.01)
*H03F 1/32* (2006.01)
*H03F 3/24* (2006.01)

(52) U.S. Cl.
CPC ............... *H03F 1/3247* (2013.01); *H03F 3/24* (2013.01); *H03F 2200/321* (2013.01); *H03F 2201/3224* (2013.01); *H03F 2201/3233* (2013.01)

(58) Field of Classification Search
CPC .................................................. H03F 1/3247
USPC .................... 330/149; 375/296; 455/114.3
See application file for complete search history.

(56) References Cited

U.S. PATENT DOCUMENTS

| | | | |
|---|---|---|---|
| 5,870,668 A | 2/1999 | Takano et al. | |
| 2007/0296494 A1* | 12/2007 | Hongo | 330/149 |
| 2010/0159856 A1* | 6/2010 | Kato et al. | 455/114.3 |
| 2010/0194474 A1 | 8/2010 | Ishikawa et al. | |

FOREIGN PATENT DOCUMENTS

| | | |
|---|---|---|
| JP | 09-069733 A | 3/1997 |
| JP | 2009-284440 A | 12/2009 |
| JP | 2010-183310 A | 8/2010 |

OTHER PUBLICATIONS

Japanese Office Action issued on Sep. 15, 2015; Japanese Application No. 2012-123723.

* cited by examiner

*Primary Examiner* — Khanh V Nguyen
*Assistant Examiner* — Khiem Nguyen
(74) *Attorney, Agent, or Firm* — Arent Fox LLP (57) ABSTRACT

A distortion compensation apparatus including: a processor configured to generate a pre-distortion signal by compensating an input signal for a distortion based on a distortion compensation coefficient and a plurality of delayed signals obtained by delaying the input signal by a plurality of amounts of delay, and an amplifier configured to generate an amplified signal by amplifying the pre-distortion signal, wherein the processor calculates the distortion compensation coefficient based on the input signal, the pre-distortion signal, and the amplified signal, and calculates the plurality of amounts of delay based on the amplified signal.

6 Claims, 11 Drawing Sheets

DISTORTION COMPENSATION APPARATUS AND DISTORTION COMPENSATION METHOD

CROSS-REFERENCE TO RELATED APPLICATION

This application is based upon and claims the benefit of priority from the prior Japanese Patent Application No. 2012-123723 filed on May 30, 2012, the entire contents of which are incorporated herein by reference.

FIELD

The embodiments discussed herein are related to a distortion compensation apparatus and a distortion compensation method.

BACKGROUND

As wireless communication has been becoming increasingly fast in recent years, bands used by signals to be sent are being widened and their dynamic ranges are being increased. In this situation, it is desirable for electric power amplifiers to have high linearity to minimize deterioration of signal quality. To make apparatuses compact, reduce operation costs, and solve environmental problems, there has been an increasing desire for electric power amplifiers that operate with high electric power conversion efficiency.

Ordinary electric power amplifiers have a trade-off between linearity and electric power conversion efficiency. To increase both linearity and electric power conversion efficiency, electric power amplifiers have been operated in a non-linear zone in which electric power conversion efficiency is high and distortion compensation, by which resulting non-linear distortion is removed, has been performed to maintain linearity.

When an output signal from an electric power amplifier is distorted, residual distortion is generated in a frequency band (stipulated by a lower frequency and an upper frequency) near the frequency of the output signal. Output signals from electric power amplifiers are expected to satisfy the Adjacent Channel Power Ratio (ACPR) standard, Spectrum Emission Mask (SEM) standard, and other standards. These standards are also referred to as spurious standards. That is, residual distortion is expected to satisfy spurious standards.

One of distortion compensation method is a pre-distortion method. In the pre-distortion method, distortion caused in an electric power amplifier is reduced by adding characteristics opposite to the distortion characteristics of the electric power amplifier to an input signal of the electric power amplifier in advance.

Japanese Laid-open Patent Publication No. 9-69733 is an example of related art.

Problems

It is known that an electric power amplifier that operates at high efficiency causes a memory effect. The memory effect is an effect in which an output corresponding to an input at a certain time is affected by an input at a previous time. In a type of distortion compensation based on a pre-distortion method, not only an input at the current time but also an input at a previous time are used to create a pre-distorted signal.

In this type of distortion compensation based on the pre-distortion method in which an input at a previous time is also used, an unbalanced frequency may be generated in residual distortion. This unbalanced frequency of residual distortion is expected to be suppressed. To restrict residual distortion, different standards may be used between a lower frequency band of the frequency band of an output signal and a higher frequency band of its frequency band.

An object of the technology in the present disclosure is to provide a distortion compensation apparatus that controls residual distortion in distortion compensation.

SUMMARY

According to an aspect of the invention, a distortion compensation apparatus including: a processor configured to generate a pre-distortion signal by compensating an input signal for a distortion based on a distortion compensation coefficient and a plurality of delayed signals obtained by delaying the input signal by a plurality of amounts of delay, and an amplifier configured to generate an amplified signal by amplifying the pre-distortion signal, wherein the processor calculates the distortion compensation coefficient based on the input signal, the pre-distortion signal, and the amplified signal, and calculates the plurality of amounts of delay based on the amplified signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present disclosure will be described below with reference to the drawings. Structures described in the embodiments are only examples; the structures disclosed here are not limited to specific structures described in the embodiments. To practice the structures disclosed here, specific structures may be appropriately used according to the embodiments. In the practice of the embodiments, they are combined as much as possible.

First embodiment

Example of a structure

Figure 1:
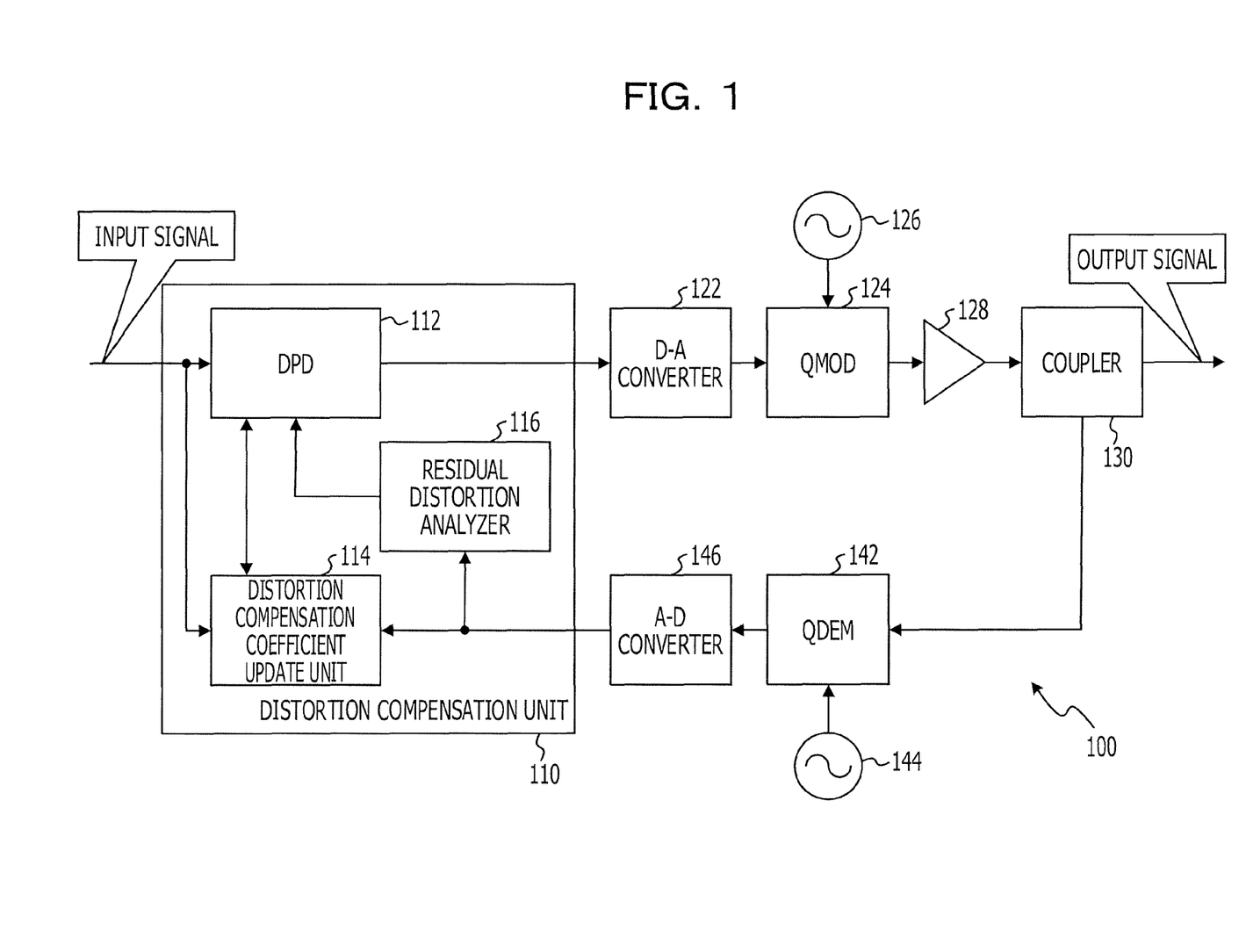
FIG. 1 illustrates an example of the structure of a distortion compensation apparatus in a first embodiment.

FIG. 1 illustrates an example of the structure of a distortion compensation apparatus 100 in a first embodiment. The distortion compensation apparatus 100 includes a distortion compensation unit 110, a digital-to-analog (D-A) converter 122, a quadrature modulator (QMOD) 124, an oscillator 126, an amplifier 128, a coupler 130, a quadrature demodulator (QDEM) 142, an oscillator 144, and an analog-to-digital (A-D) converter 146. The distortion compensation unit 110 includes a digital pre-distortion (DPD) unit 112, a distortion compensation coefficient update unit 114, and a residual distortion analyzer 116.

Input signals (transmission data) such as an in-phase (I) signal and a quadrature (Q) signal are supplied to the distortion compensation apparatus 100. An input signal is a digital signal. The distortion compensation apparatus 100 converts an input signal to an analog signal, amplifies the converted analog signal at a prescribed amplification ratio, and outputs the amplified signal. An output signal sent from the distortion compensation apparatus 100 is an analog signal. In the distortion compensation apparatus 100, distortion compensation processing is carried out to suppress distortion in the output signal.

The DPD unit 112 performs distortion compensation processing, in which a pre-distorted signal is created, for an input signal according to a distortion compensation coefficient output from the distortion compensation coefficient update unit 114 and to information output from the residual distortion analyzer 116.

The distortion compensation coefficient update unit 114 calculates a distortion compensation coefficient by using an input signal, a pre-distorted signal corresponding to the input signal, and an output signal corresponding to the input signal and pre-distorted signal.

The residual distortion analyzer 116 calculates residual distortion in a frequency band near the frequency of a transmission signal. The residual distortion analyzer 116 also calculates an amount of delay in pre-distortion according to the calculated residual distortion. The DPD unit 112 is notified of information determined by the residual distortion analyzer 116.

The D-A converter 122 receives a pre-distorted signal from the distortion compensation unit 110 and converts the received signal, which is a digital signal, to an analog signal.

The QMOD 124 orthogonally modulates the analog signal output from the D-A converter 122 by using the oscillation frequency of the oscillator 126.

The oscillator 126 oscillates a carrier frequency. A signal at the carrier frequency oscillated by the oscillator 126 is output to the QMOD 124. The oscillator 126 may be combined with the oscillator 144.

The amplifier 128 receives the signal output from the QMOD 124. The amplifier 128 amplifies the received signal and creates an output signal (transmission signal).

The coupler 130 retrieves part of the transmission signal output from the amplifier 128 and outputs the retrieved signal to the QDEM 142. The remaining part of the transmission signal, which has not been retrieved by the coupler 130, is output to, for example, an antenna (not illustrated) and is then output from the antenna to another apparatus.

The QDEM 142 receives the signal retrieved by the coupler 130. The QDEM 142 then orthogonally demodulates the received signal by using the oscillation frequency of the oscillator 144.

The oscillator 144 oscillates a carrier frequency. A signal at the carrier frequency oscillated by the oscillator 144 is output to the QDEM 142. The oscillator 144 may be combined with the oscillator 126.

The A-D converter 146 receives the orthogonally modulated signal from the QDEM 142. The A-D converter 146 then converts the received signal, which is an analog signal, to a digital signal. The signal converted by the A-D converter 146 is output to the distortion compensation unit 110.

Example of the Hardware Structure

Figure 2:
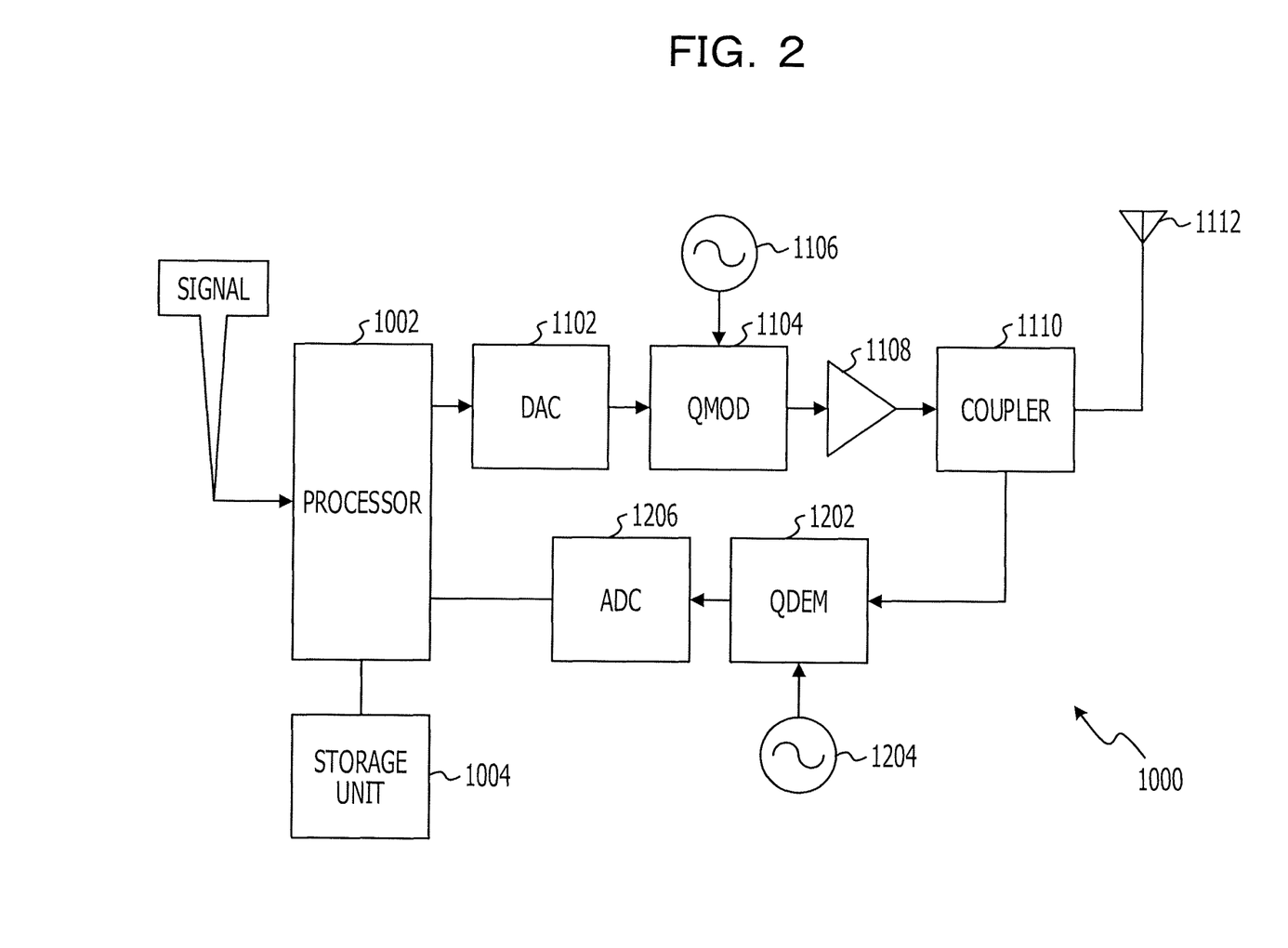
FIG. 2 illustrates an example of the hardware structure of the distortion compensation apparatus in the first embodiment.

FIG. 2 illustrates an example of the hardware structure of a distortion compensation apparatus 1000 in the first embodiment. The distortion compensation apparatus 1000 receives a digital signal, orthogonally coverts the received digital signal to a signal with a carrier frequency, amplifies the signal, and outputs the amplified signal. The distortion compensation apparatus 1000 includes a processor 1002, a storage unit 1004, a digital-to-analog converter (DAC) 1102, a QMOD 1104, an oscillator 1106, and an amplifier 1108. The distortion compensation apparatus 1000 further includes a coupler 1110, an antenna 1112, a QDEM 1202, an oscillator 1204, and an analog-to-digital converter (ADC) 1206. The distortion compensation apparatus 100 is implemented by, for example, a hardware structure such as that of the distortion compensation apparatus 1000.

The processor 1002 is, for example, a central processing unit (CPU) or a digital signal processor (DSP). The processor 1002 controls the whole of the distortion compensation apparatus 1000. The processor 1002 may be an application-specific integrated circuit (ASIC), a field-programmable gate array (FPGA), a large-scale integrated (LSI) chip, or the like.

The storage unit 1004 is, for example, a random-access memory (RAM) or a read-only memory (ROM). Alternatively, the storage unit 1004 is, for example, an erasable programmable read-only memory (EPROM) or a hard disk drive (HDD). A secondary storage unit may include a removable medium, that is, a transportable recording medium. Examples of the removable medium include universal serial bus (USB) memories, compact disks (CDs), digital versatile disks (DVDs), and other disk recording media. The storage unit 1004 may store input signals, output signals, distortion compensation coefficients, amounts of delay, and the like.

The distortion compensation apparatus 1000 implements the functions of the distortion compensation unit 110 and the like by having the processor 1002 execute programs stored in the storage unit 1004.

The DAC 1102 converts digital signals output from the processor 1002 to analog signals. The DAC 1102 implements the functions of the D-A converter 122.

The QMOD 1104 implements the functions of the QMOD 124. The oscillator 1106 implements the functions of the oscillator 126.

The amplifier 1108 amplifies analog signals output from the QMOD 1104. The amplifier 1108 has the functions of the amplifier 128. Any of various amplifiers is used as the amplifier 1108.

The coupler 1110 extracts part of an output signal output from the amplifier 1108. The extracted signal is input to the QDEM 1202. The coupler 1110 implements the function of the coupler 130.

The antenna 1112 transmits a signal combined by a combiner 1012 to another apparatus.

The QDEM 1202 has the functions of the QDEM 142. The oscillator 1204 implements the functions of the oscillator 144.

The ADC 1206 converts analog signals output from the QDEM 1202 to digital signals. The DAC 1102 implements the functions of the A-D converter 146.

Data, coefficients, input signals, output signals, and other information used by the distortion compensation unit 110 are stored in the storage unit 1004. The input signals and output signals may respectively include previous input signals and previous output signals.

It is possible to execute a series of processing not only by hardware but also by software.

Example of Operation

Series Digital Distortion

Now, series digital distortion will be described. When a transmission signal is amplified by an electric power amplifier, higher electric power conversion efficiency is obtained with more back-off suppressed. When electric power conversion efficiency is increased, however, non-linear distortion may be generated, in which case the SEM and ACPR standards for spurious characteristics may not be satisfied. In view of this, a digital pre-distortion (DPD) technology has been developed as a distortion compensation method. With the DPD technology, a signal equivalent to characteristics opposite to the characteristics of non-linear distortion generated by an electric power amplifier are taken as an input signal in advance to cancel out distortion for compensation.

There are types of non-linear distortion generated by electric power amplifiers. An example of distortion has amplitude modulation-amplitude modulation (AM-AM) characteristics and amplitude modulation-phase modulation (AM-PM) characteristics, in which an output is uniquely determined according to a current input signal of the electric power amplifier. Another example of distortion is affected by a so-called memory effect, in which there is an influence by a previous transmission signal.

As model technologies for non-linear distortion generated by an electric power amplifier having the memory effect, the Volterra series, the general polynomial series, the memory polynomial series, and other series methods have been proposed. A series based on these series may be used in this embodiment.

An expression given below is an example of an expression to obtain a transmission signal (pre-distorted signal) for which non-linear distortion caused by an electric power amplifier is compensated by a general polynomial series expansion equation.

$$PD(t) = \sum_{i=0}^{Delay} \sum_{j=0}^{Delay} \sum_{k=0}^{N} h_{i,j,k} |x(t-j)|^k x(t-i)$$

where PD is a pre-distorted signal (distortion-compensated signal), x(t) is a transmission signal at a time t, h is a distortion compensation coefficient, and Delay (also referred to as $D_0$) is an amount of delay, which is determined by a degree of influence by the memory effect. Delay is the maximum amount of delay handled in this series. N is the maximum order handled in this series. The maximum amount of delay is obtained in advance from, for example, the characteristics of the electric power amplifier. The distortion compensation coefficient h is calculated by the distortion compensation coefficient update unit 114.

A variable t is a variable in time. The unit of the time t is, for example, a sampling time interval. Instead of variables i and j, Δt×i and Δt×j may be respectively used and Δt may be used as the sampling time interval. Another unit of the time t may be used. This is also true for the variables t, i, and j used in other equations.

Example of Operation of the Distortion Compensation Apparatus

Figure 3:
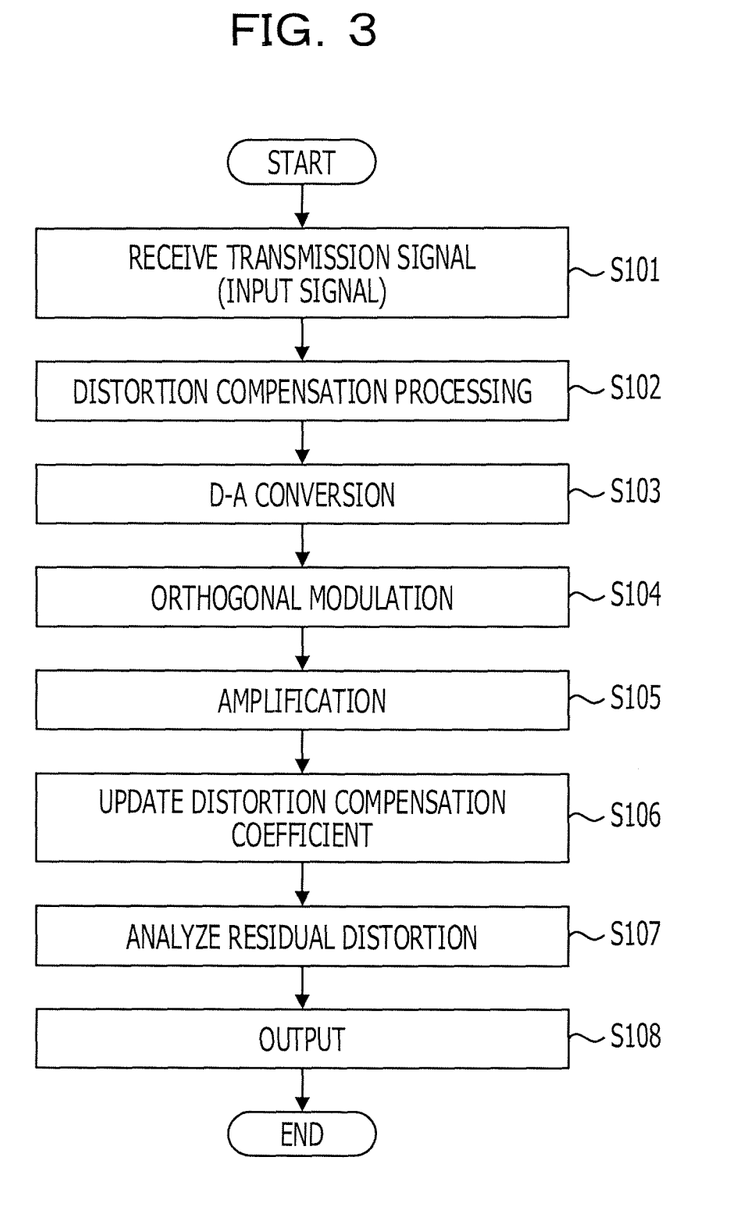
FIG. 3 illustrates an example of an operation flow executed by the distortion compensation apparatus.

FIG. 3 illustrates an example of an operation flow executed by the distortion compensation apparatus 100.

The distortion compensation unit 110 in the distortion compensation apparatus 100 receives a transmission signal (input signal) (S101). The received signal is input to the DPD 112 and distortion compensation coefficient update unit 114.

The DPD unit 112 performs distortion compensation processing on the input signal (S102); the DPD unit 112 calculates a pre-distorted signal from a current input signal, a previous input signal, a distortion compensation coefficient, and information from the residual distortion analyzer 116. An in-phase (I) signal, a quadrature (Q) signal, and other input signals (transmission data) are supplied to the DPD unit 112. Signals represented by polar coordinates (r, 0) may be supplied to the DPD unit 112 instead.

In the DPD unit 112, the pre-distorted signal is calculated by an equation below.

$$PD(t) = \sum_{k=0}^{N} h_{0,0,k} |x(t)|^k x(t) + \sum_{k=0}^{N} h_{i_0,j_0,k} |x(t-j_0)|^k x(t-i_0)$$

where h is the distortion compensation coefficient calculated by the distortion compensation coefficient update unit 114, $i_0$ and $j_0$ are each an amount of delay obtained by the residual distortion analyzer 116, x(t) is an input signal at the time t, and x(t−$t_0$) is a delay signal with an amount $t_0$ of delay at the time t. The initial values of $i_0$ and $j_0$ are each $D_0$. The DPD unit 112 uses the amounts $i_0$ and $j_0$ of delay, the notification of which is sent to the DPD unit 112 by the residual distortion analyzer 116, uses to calculate the pre-distorted signal. The DPD unit 112 continues to use the amounts $i_0$ and $j_0$ of delay of which the DPD unit 112 is last notified.

The D-A converter 122 converts the pre-distorted signal output from the DPD unit 112, which is a digital signal, to an analog signal (S103).

The QMOD 124 orthogonally modulates the analog signal output from the D-A converter 122 by using the oscillation frequency of the oscillator 126 (S104).

The amplifier 128 amplifies the signal that has been orthogonally modulated by the QMOD 124 (S105). Part of the amplified signal is retrieved by the coupler 130 and is then output to the QDEM 142. The QDEM 142 receives the signal and orthogonally demodulates the received signal by using the oscillation frequency of the oscillator 144, after which the QDEM 142 outputs the orthogonally demodulated signal to the A-D converter 146. The A-D converter 146 receives the signal from the QDEM 142 and converts the received signal, which is an analog signal, to a digital signal. The digital signal converted by the A-D converter 146 is output to the distortion compensation coefficient update unit 114 and residual distortion analyzer 116 in the distortion compensation unit 110.

The distortion compensation coefficient update unit 114 calculates a distortion compensation coefficient by using an input signal, a delay signal, a pre-distorted signal corresponding to the input signal, and an output signal corresponding to the input signal and pre-distorted signal (S106). A method of calculating the distortion compensation coefficient may be, for example, a method based on a least mean square (LMS) algorithm or a method based on an exponentially weighted recursive least mean (RLS) algorithm. However, an algorithm to be used in the method of calculating the distortion compensation coefficient is not limited to these algorithms. The distortion compensation coefficient is updated at, for example, intervals of a prescribed time. The characteristics of the amplifier 128 may change according to, for example, the aging, working temperature, environment temperature, and input signal. Thus, when the distortion compensation coefficient is updated at intervals of a prescribed time, it becomes possible for the distortion compensation coefficient to track changes in the characteristics of the amplifier 128. The calculation and update of the distortion compensation coefficient may be carried out independently of this operation flow.

The residual distortion analyzer 116 calculates residual distortion in a frequency band near the frequency of a transmission signal. The residual distortion analyzer 116 also calculates an amount of delay in pre-distortion according to the calculated residual distortion, the spurious standards, and the like (S107). Calculation of the amount of delay in the residual distortion analyzer 116 will be described later. The calculated amount of delay is output to the DPD unit 112.

The output signal amplified by the amplifier 128 is output as an output signal from the distortion compensation apparatus 100 (S108). The output signal is transmitted through, for example, an antenna or the like to another apparatus.

The steps in the operation flow may be executed in time series in the order indicated in FIG. 3 or may not be executed in time series in the indicated order. That is, the steps in the operation flow may be executed concurrently or individually. This is also true for other operation flows described later.

Figure 4A:
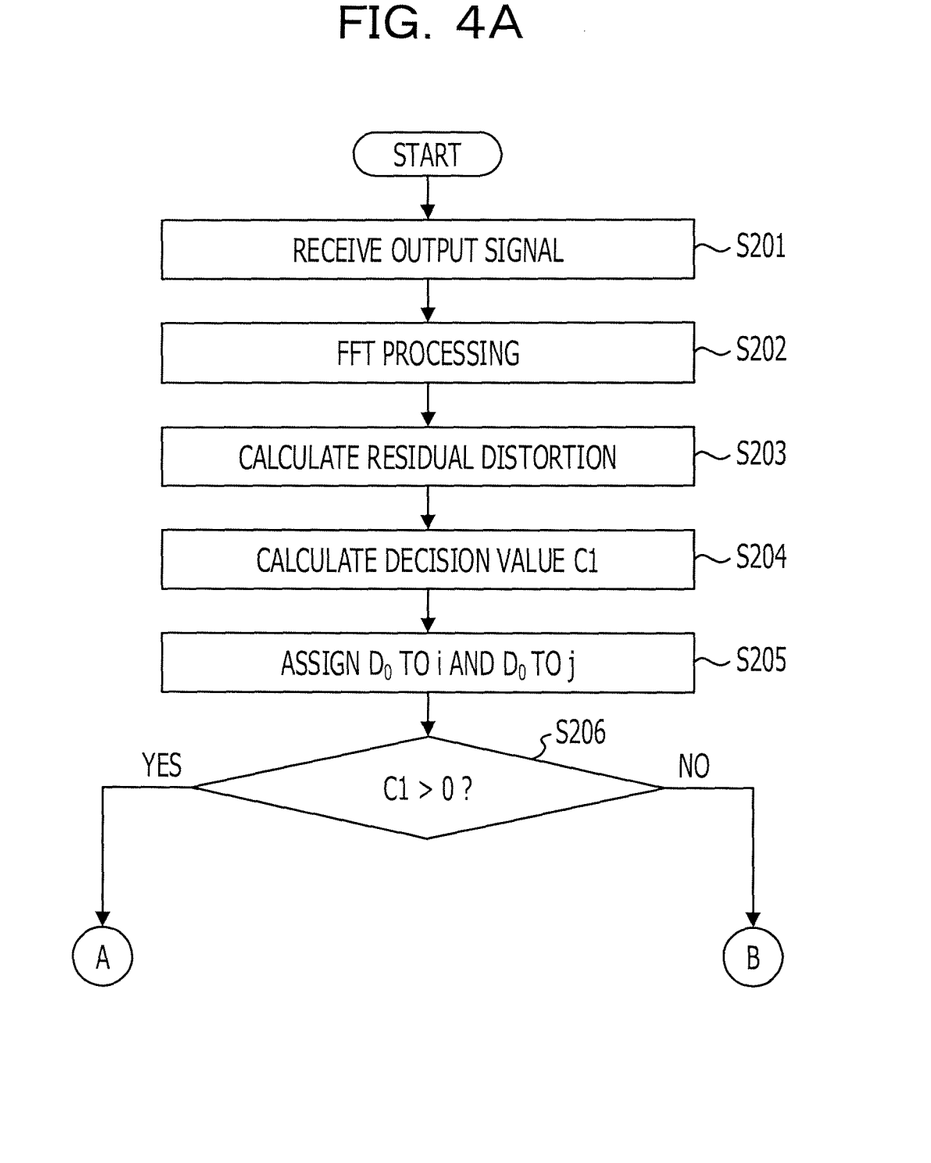
FIG. 4A illustrates an example of an operation flow executed by residual distortion analyzer to calculate an amount of delay.
Figure 4B:
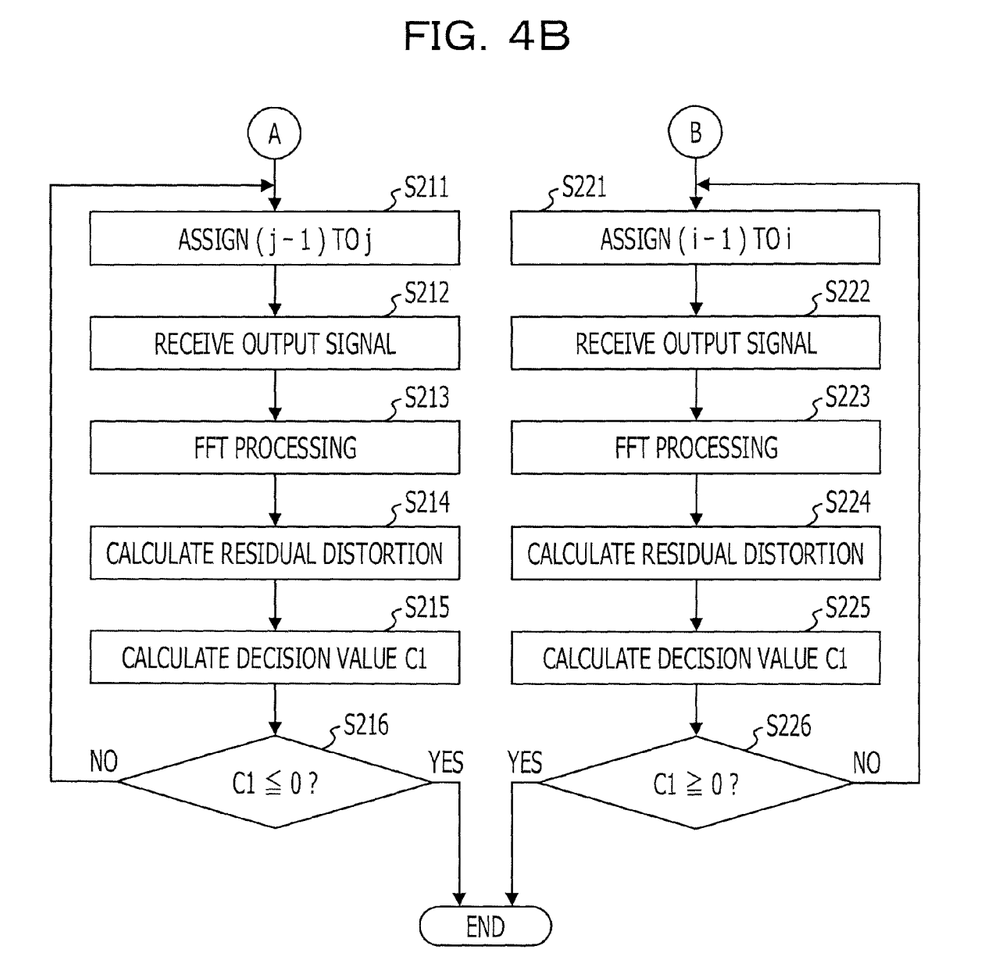
FIG. 4B illustrates an example of an operation flow continued from FIG. 4A.

First operation example of calculating an amount of delay in the residual distortion analyzer FIGS. 4A and 4B illustrate an example of an operation flow executed by residual distortion analyzer 116 to calculate an amount of delay. The connectors A and B in FIG. 4A are respectively connected to the connectors A and B in FIG. 4B.

The residual distortion analyzer 116 receives a digital signal, which is an output signal, from the A-D converter 146 (S201). The residual distortion analyzer 116 then performs a fast Fourier transform (FFT) on the received output signal (S202).

The residual distortion analyzer 116 then calculates the residual distortion of the signal resulting from the FFT (S203). The residual distortion is an undesired signal component in a frequency band near the frequency of the output signal. A prescribed frequency at the bottom of the frequency band of the output signal is referred to as a lower frequency. A prescribed frequency at the top of the frequency band of the output signal is referred to as an upper frequency. Residual distortion at the lower frequency is, for example, the average of electric power of signals in the frequency band of the lower frequency. In this case, residual distortion at the upper frequency is the average of electric power of signals in the frequency band of the upper frequency. Alternatively, residual distortion at the lower frequency is, for example, the maximum electric power of signals in the frequency band of the lower frequency. In this case, residual distortion at the upper frequency is the maximum electric power of signals in the frequency band of the upper frequency. Definition of residual distortion may be changed according to the spurious standard used. In the description below, the residual distortion at the lower frequency will be represented as L and the residual distortion at the upper frequency will be represented as U. A value in the spurious standard at the lower frequency is represented as $M_L$ and a value in the spurious standard at the upper frequency is represented as $M_U$. To satisfy the spurious standard, the residual distortion is expected to be less than the values in the spurious standard. Furthermore, the residual distortion is expected to be less than the values in the spurious standard with good balance at the lower frequency and upper frequency. That is, the value of $(M_L-L)$ and the value of $(M_U-U)$ are expected to be the same. The value of $M_L$ and the value of $M_U$ may be different or may be the same. Values (limits) other than the values in the spurious standard may be used as the upper limit $(M_L)$ of the residual distortion at the lower frequency and the upper limit $(M_U)$ of the residual distortion at the upper frequency.

The residual distortion analyzer 116 calculates a decision value C1 (S204). The decision value C1 is calculated by subtracting $(M_U-U)$ from $(M_L-L)$. The residual distortion analyzer 116 also assigns $D_0$ to the variable i and $D_0$ to the variable j (S205).

The residual distortion analyzer 116 decides whether the decision value C1 is greater than 0 (S206). If the decision value C1 is greater than 0 (the result in step S206 is Yes), processing proceeds to step S211. If the decision value C1 is smaller than or equal to 0 (the result in step S206 is No), processing proceeds to step S221. When the decision value C1 is greater than 0, it indicates that it is desirable to reduce the residual distortion at the upper frequency. When the decision value C1 is smaller than or equal to 0, it indicates that it is desirable to reduce the residual distortion at the upper frequency.

In step S211, the residual distortion analyzer 116 assigns (j−1) to the variable j (S211). The residual distortion analyzer 116 takes the variable i (=$D_0$) as $i_0$ and the variable j after the assignment as $j_0$ and notifies the DPD unit 112 of $i_0$ and $j_0$.

The residual distortion analyzer 116 receives an output signal that corresponds to a pre-distorted signal calculated by using $i_0$ and $j_0$, the notification of which has been sent to the DPD unit 112 in step S211 (S212). The residual distortion analyzer 116 performs an FFT on the received output signal as in step S202 (S213). The residual distortion analyzer 116 calculates the residual distortion of the signal resulting from the FFT as in step S203 (S214). The residual distortion analyzer 116 calculates the decision value C1 as in step S204 (S215).

The residual distortion analyzer 116 decides whether the decision value C1 is smaller than or equal to 0 (S216). If the decision value C1 is smaller than or equal to 0 (the result in step S216 is Yes), processing by the residual distortion analyzer 116 is terminated. If the decision value C1 is greater than 0 (the result in step S216 is No), processing returns to step S211.

In step S221, the residual distortion analyzer 116 assigns (i−1) to the variable i (S221). The residual distortion analyzer 116 takes the variable i after the assignment as $i_0$ and the variable j (=$D_0$) as $j_0$ and notifies the DPD unit 112 of $i_0$ and $j_0$.

The residual distortion analyzer 116 receives an output signal that corresponds to a pre-distorted signal calculated by using $i_0$ and $j_0$, the notification of which has been sent to the DPD unit 112 in step S221 (S222). The residual distortion analyzer 116 performs an FFT on the received output signal as in step S202 (S223). The residual distortion analyzer 116 calculates the residual distortion of the signal resulting from the FFT as in step S203 (S224). The residual distortion analyzer 116 calculates the decision value C1 as in step S204 (S225).

The residual distortion analyzer 116 decides whether the decision value C1 is greater than or equal to 0 (S226). If the decision value C1 is greater than or equal to 0 (the result in step S226 is Yes), processing by the residual distortion analyzer 116 is terminated. If the decision value C1 is smaller than 0 (the result in step S226 is No), processing returns to step S221.

When the sign of the decision value C1 is reversed, the residual distortion analyzer 116 decides that ($M_L$–L) and ($M_U$–U) have becomes almost the same and regards that the residual distortion at the lower frequency and the residual distortion at the upper frequency have been balanced.

Example of Operation to Confirm the Characteristics of the Amplifier in the Residual Distortion Analyzer In the example in FIGS. 4A and 4B, when the variable j has been reduced, the residual distortion at the upper frequency has been reduced; when the variable i has been reduced, the residual distortion at the lower frequency has been reduced. The example in FIGS. 4A and 4B may be used when it is known that the characteristics of the amplifier 128 are such that as the value of the variable j is reduced, the residual distortion at the upper frequency is reduced and that when the value of the variable i is reduced, residual distortion at the lower frequency is reduced. In general, however, it is unknown whether the characteristics of the amplifier 128 are such that as the value of the variable i or j is reduced, the residual distortion at the upper frequency is reduced or the residual distortion at the lower frequency is reduced. Therefore, when the characteristics of the amplifier 128 are unknown, it is desirable to conform in advance whether the characteristics of the amplifier 128 are such that as the value of the variable i is reduced, the residual distortion at the upper frequency is reduced or the residual distortion at the lower frequency is reduced.

Figure 5:
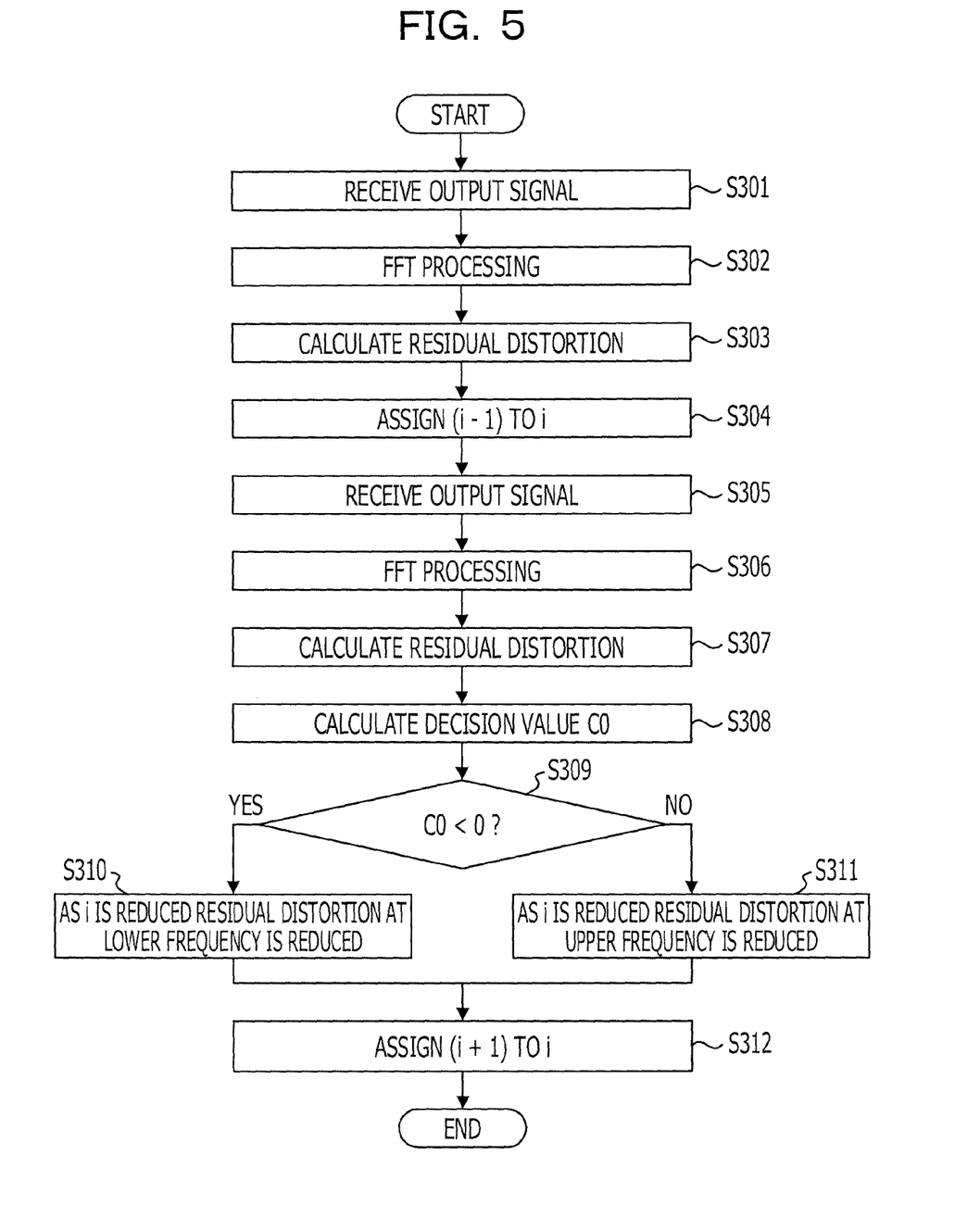
FIG. 5 illustrates an example of an operation flow executed by the residual distortion analyzer to confirm the characteristics of an amplifier.

FIG. 5 illustrates an example of an operation flow executed by the residual distortion analyzer 116 to confirm the characteristics of the amplifier 128. When the characteristics of the amplifier 128 are unknown, the operation flow in FIG. 5 is executed before the operation flows in FIGS. 4A, 4B and the like are executed.

The residual distortion analyzer 116 receives a digital signal, which is an output signal, from the A-D converter 146 (S301). The residual distortion analyzer 116 then performs a fast Fourier transform (FFT) on the received output signal (S302).

The residual distortion analyzer 116 then calculates the residual distortion of the signal resulting from the FFT (S303). In the description below, the residual distortion at the lower frequency will be represented as L1 and the residual distortion at the upper frequency will be represented as U1. It is assumed here that the initial value of the variable i is, for example, $D_0$ and the initial value of the variable j is, for example, $D_0$.

The residual distortion analyzer 116 assigns (i–1) to the variable i (S304). The residual distortion analyzer 116 takes the variable i after the assignment as $i_0$ and the variable j as $j_0$ and notifies the DPD unit 112 of $i_0$ and $j_0$.

The residual distortion analyzer 116 receives an output signal that corresponds to a pre-distorted signal calculated by using $i_0$ and $j_0$, the notification of which has been sent to the DPD unit 112 in step S304 (S305). The residual distortion analyzer 116 performs an FFT on the received output signal as in step S302 (S306).

The residual distortion analyzer 116 calculates the residual distortion of the signal resulting from the FFT as in step S303 (S307). In the description below, the residual distortion at the lower frequency will be represented as L2 and the residual distortion at the upper frequency will be represented as U2.

The residual distortion analyzer 116 calculates a decision value C0 (S308). The decision value C0 is calculated by subtracting (L2–U2) from (L1–U1).

The residual distortion analyzer 116 decides whether the decision value C0 is smaller than 0 (S309). If the decision value C0 is smaller than 0 (the result in step S309 is Yes), the residual distortion analyzer 116 decides that the characteristics of the amplifier 128 are such that as the value of the variable i is reduced, the residual distortion at the lower frequency is reduced (S310). After that, the residual distortion analyzer 116 determines $i_0$ and $j_0$ according to the operation flows in FIGS. 4A and 4B.

If the decision value C0 is greater than or equal to 0 (the result in step S309 is No), the residual distortion analyzer 116 decides that the characteristics of the amplifier 128 are such that as the value of the variable i is reduced, the residual distortion at the upper frequency is reduced (S311). After that, the residual distortion analyzer 116 determines $i_0$ and $j_0$ according to the operation flows in FIGS. 6A and 6B.

In step S312, the residual distortion analyzer 116 assigns (i+1) to the variable i. The residual distortion analyzer 116 takes the variable i after the assignment as $i_0$ and the variable j as $j_0$ and notifies the DPD unit 112 of $i_0$ and $j_0$. The residual distortion analyzer 116 then terminates the operation flow in FIG. 5.

Thus, the residual distortion analyzer 116 may decide the characteristics, of the amplifier 128, that change in response to a change in the variable i by executing the operation flow in FIG. 5.

Figure 6A:
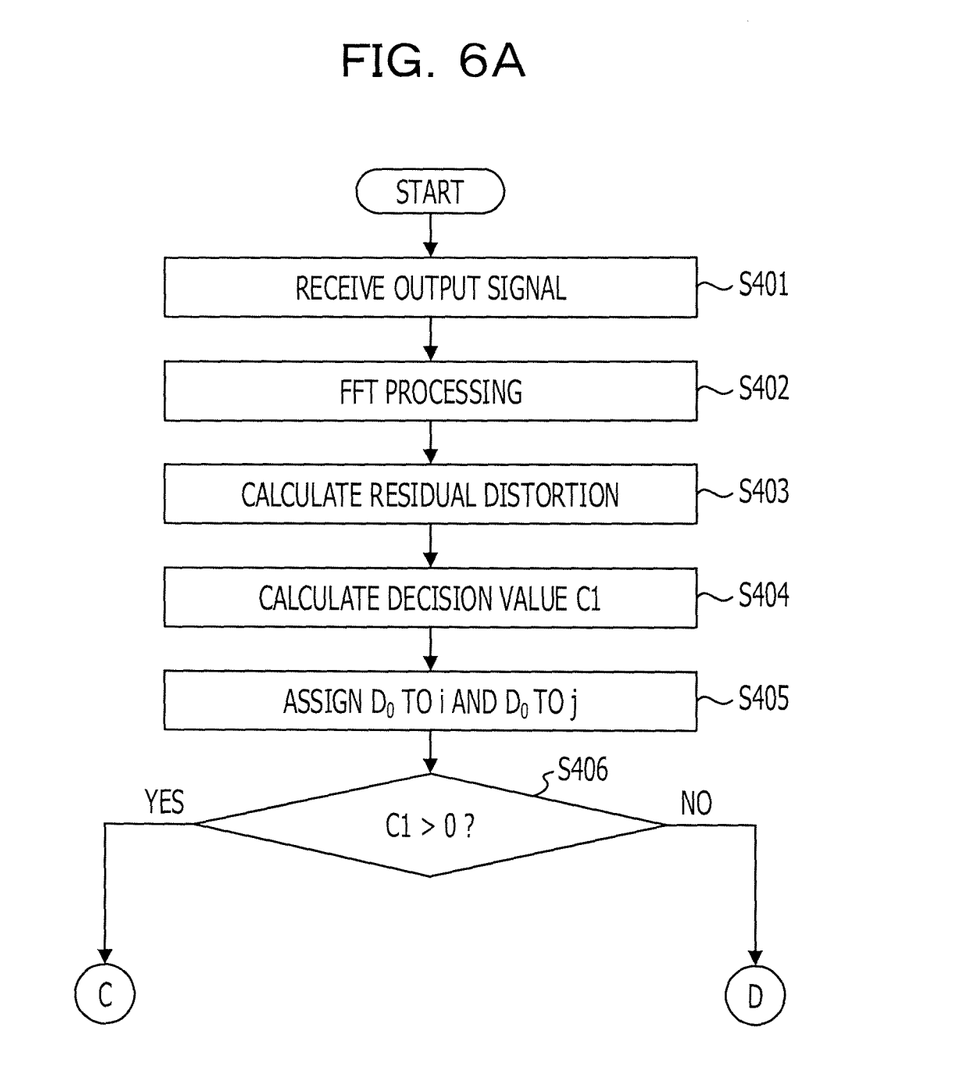
FIG. 6A illustrates another example of an operation flow executed by the residual distortion analyzer to calculate an amount of delay.
Figure 6B:
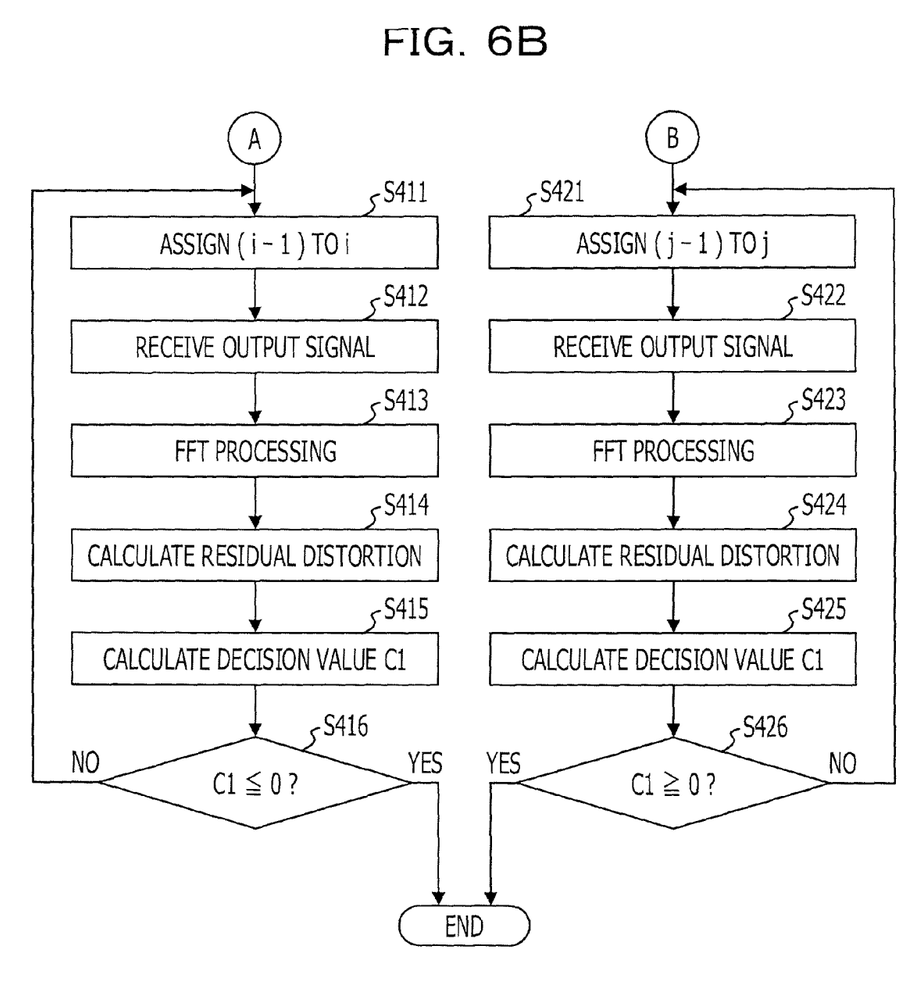
FIG. 6B illustrates an example of an operation flow continued from FIG. 6A.

Second Operation Example of Calculating an Amount of Delay in the Residual Distortion Analyzer FIGS. 6A and 6B illustrate another example of an operation flow executed by the residual distortion analyzer 116 to calculate an amount of delay. The connectors C and D in FIG. 6A are respectively connected to the connectors C and D in FIG. 6B.

In the example in FIGS. 4A and 4B, as the value of the variable j has been reduced, the residual distortion at the upper frequency has been reduced and as the value of the variable i has been reduced, the residual distortion at the lower frequency has been reduced. Now, an example in which as the value of the variable j is reduced, the residual distortion at the lower frequency is reduced and as the value of the variable i is reduced, the residual distortion at the upper frequency has been reduced will be described with reference to FIGS. 6A and 6B.

Some steps in the operation flows in FIGS. 6A and 6B are the same as in the operation flows in FIGS. 4A and 4B. Descriptions of the same steps will be omitted and different steps will be mainly described below.

In step S411, the residual distortion analyzer 116 assigns (i–1) to the variable i. The residual distortion analyzer 116 takes the variable i after the assignment as $i_0$ and the variable j (=$D_0$) as $j_0$ and notifies the DPD unit 112 of $i_0$ and $J_0$.

In step S421, the residual distortion analyzer 116 assigns (j–1) to the variable j. The residual distortion analyzer 116 takes the variable i (=$D_0$) as $i_0$ and the variable j after the assignment as $j_0$ and notifies the DPD unit 112 of $i_0$ and $j_0$.

Processing in other steps in the operation flows in FIGS. 6A and 6B are the same as in the operation flows in FIGS. 4A and 4B.

First Variation

Calculation of the pre-distorted signal in the DPD unit 112 may be carried out by using an equation given below instead of the equation described above.

$$PD(t) = \sum_{k=0}^{N} h_{0,0,k} |x(t)|^k x(t) + \sum_{i=i_0}^{D_0} \sum_{j=j_0}^{D_0} \sum_{k=0}^{N} h_{i,j,k} |x(t-j)|^k x(t-i)$$

In this equation, when, for example, the residual distortion at the upper frequency is reduced by reducing the value of the variable j, a plurality of terms (j =$D_0$, j=$D_0$–1, and so on) that contribute to reducing the residual distortion at the upper frequency may be included in the pre-distorted signal.

Second Variation

A case in which there are an upper limit for the residual distortion at the lower frequency and an upper limit for the residual distortion at the upper frequency has been described above. Now, a case in which an upper limit is set for the residual distortion at the lower frequency but no upper limit is set for the residual distortion at the upper frequency.

Figure 7:
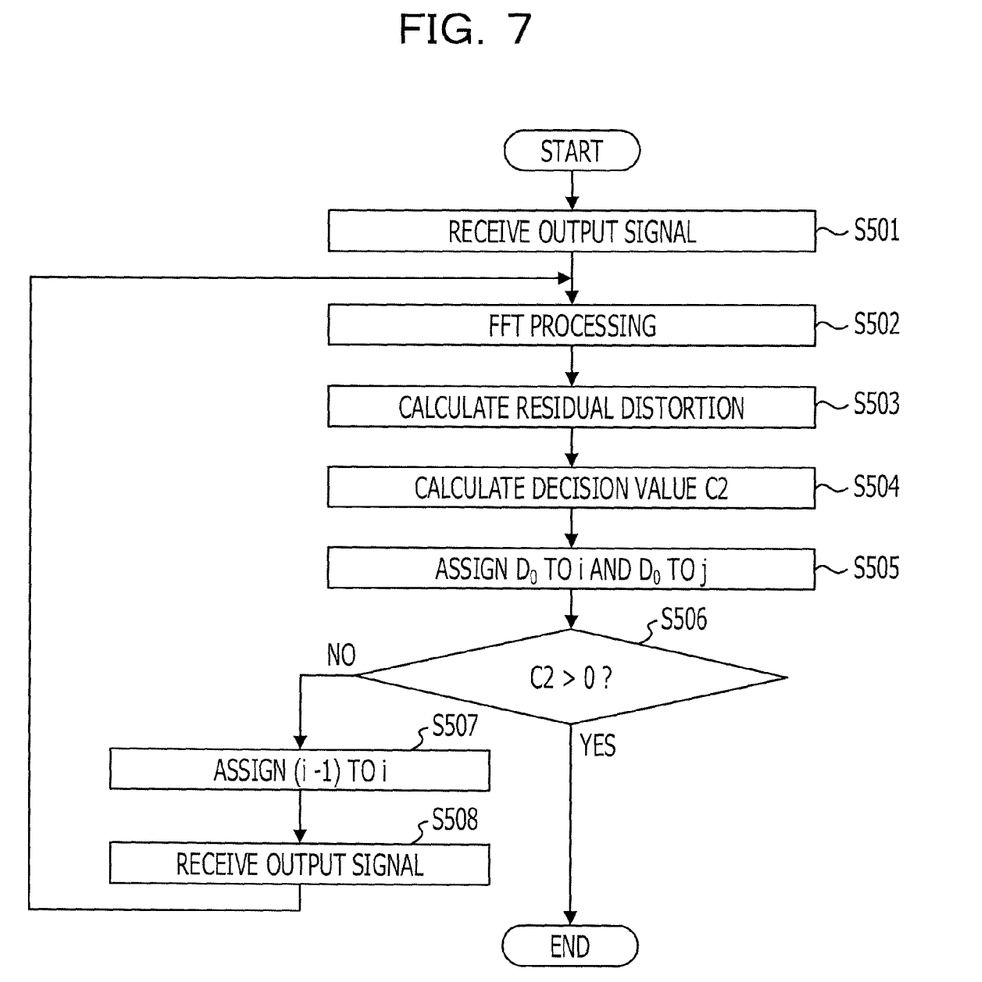
FIG. 7 illustrates an example of an operation flow executed by the residual distortion analyzer when an upper limit is set for residual distortion at a lower frequency.

FIG. 7 illustrates an example of an operation flow executed by the residual distortion analyzer 116 when an upper limit is set for the residual distortion at the lower frequency. The operation flow in FIG. 7 is executed when it has been decided in the operation flow in FIG. 5 that as the value of the variable i is reduced, the residual distortion at the lower frequency is reduced.

The residual distortion analyzer 116 receives a digital signal, which is an output signal, from the A-D converter 146 (S501). The residual distortion analyzer 116 then performs a fast Fourier transform (FFT) on the received output signal (S502).

The residual distortion analyzer 116 then calculates the residual distortion of the signal resulting from the FFT (S503). In this step, it suffices to calculate at least the residual distortion at the lower frequency. The residual distortion at the lower frequency will be represented as L. An upper limit (a value in the spurious standard, for example) for the residual distortion at the lower frequency will be represented as $M_L$.

The residual distortion analyzer 116 calculates a decision value C2 (S504). The decision value C2 is calculated by subtracting L from $M_L$. The residual distortion analyzer 116 also assigns $D_0$ to the variable i and $D_0$ to the variable j (S505).

The residual distortion analyzer 116 decides whether the decision value C2 is greater than 0 (S506). If the decision value C2 is greater than 0 (the result in step S506 is Yes), processing is terminated. When the decision value C2 is greater than 0, it indicates that the residual distortion at the lower frequency is less than the upper limit.

If the decision value C2 is smaller than or equal to 0 (the result in step S506 is No), processing proceeds to step S507. When the decision value C2 is smaller than or equal to 0, it indicates that the residual distortion at the lower frequency is greater than or equal to the upper limit. In this case, the residual distortion at the lower frequency is reduced in subsequent processing.

The residual distortion analyzer 116 assigns (i−1) to the variable i (S507). The residual distortion analyzer 116 takes the variable i after the assignment as $i_0$ and the variable j (=$D_0$) as $j_0$ and notifies the DPD unit 112 of $i_0$ and $j_0$.

The residual distortion analyzer 116 receives an output signal that corresponds to a pre-distorted signal calculated by using $i_0$ and $j_0$, the notification of which has been sent to the DPD unit 112 in step S507 (S508). Processing then returns to step S502.

In the operation flow in FIG. 7, the residual distortion analyzer 116 may suppress the residual distortion at the lower frequency below a prescribed upper limit. The operation flow example in FIG. 7 is an example in which as the value of the variable i is reduced, the residual distortion at the lower frequency is reduced. In a case as well in which as the value of the variable j is reduced, the residual distortion at the lower frequency is reduced, the residual distortion analyzer 116 may suppress residual distortion at the lower frequency below a prescribed upper limit by assigning (j−1) to the variable j instead in step S507. This is also true for a case in which the residual distortion at the upper frequency is suppressed below a prescribed upper limit.

Effects in the first embodiment

The distortion compensation apparatus 100 selects some terms from a series such as a general polynomial series expansion equation and creates a pre-distorted signal. The residual distortion analyzer 116 analyzes residual distortion to select a term used in the creation of the pre-distorted signal. The distortion compensation apparatus 100 may control the residual distortion without having to add circuits.

Figure 8:
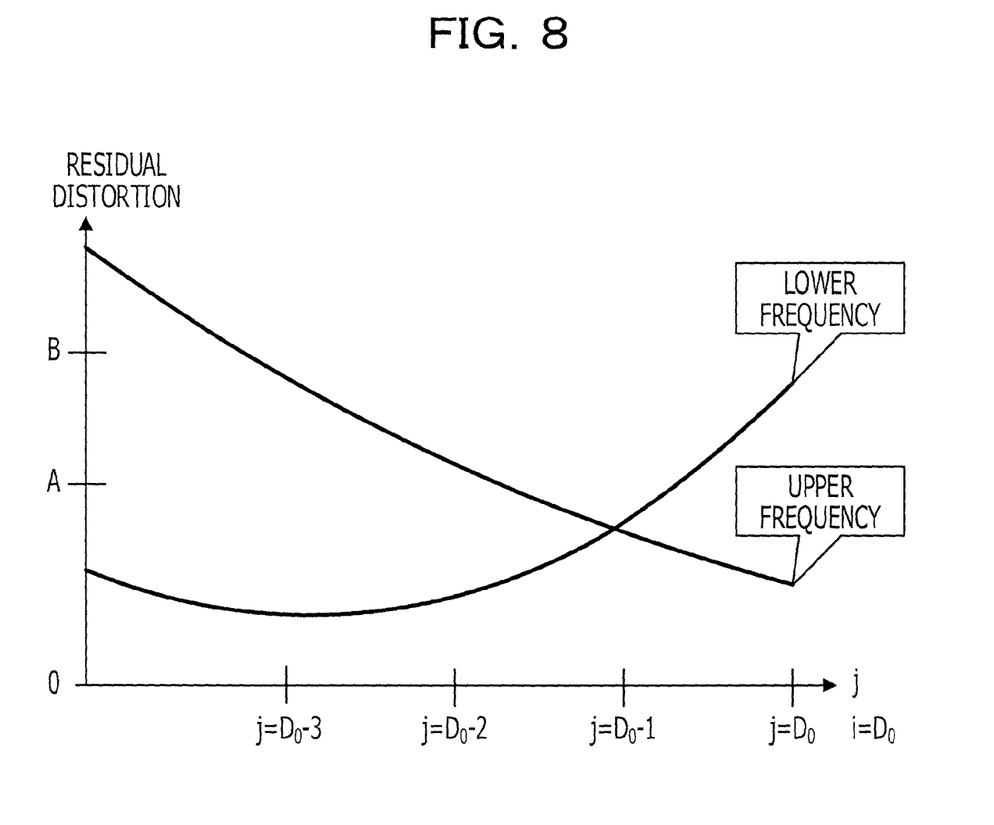
FIG. 8 illustrates changes in residual distortion at the lower frequency and residual distortion at an upper frequency when the value of a variable j is reduced.

FIG. 8 illustrates an example of changes in the residual distortion at the lower frequency and the residual distortion at the upper frequency when the value of the variable j reduced. In the graph in FIG. 8, the variable j is plotted on the horizontal axis and the residual distortion is plotted on the vertical axis. The example in FIG. 8 indicates that as the value of the variable j is reduced from $D_0$ to ($D_0$−3), the residual distortion at the lower frequency is reduced and the residual distortion at the upper frequency is increased. That is, the amplifier 128 in the example in FIG. 8 has characteristics that when the value of the variable j is reduced, the residual distortion at the lower frequency is reduced and the residual distortion at the upper frequency is increased. It is found that if, for example, the upper limit of the residual distortion at the lower frequency and the upper limit of the residual distortion at the upper frequency are both A, the residual distortion at the lower frequency and the residual distortion at the upper frequency are balanced by setting the amount of delay j to ($D_0$−1). It is also found that if, for example, the upper limit of the residual distortion at the lower frequency is A and the upper limit of the residual distortion at the upper frequency is B, the residual distortion at the lower frequency and the residual distortion at the upper frequency are balanced by setting the amount of delay j to ($D_0$−2). The distortion compensation apparatus 100 may obtain a frequency balance in residual distortion by changing the amount $i_0$ of delay and the amount $j_0$ of delay according to the residual distortion.

Second embodiment

Next, a second embodiment will be described. Some points in the second embodiment are the same as in the first embodiment. Different points from the first embodiment will be mainly described below and descriptions common to the first embodiment and second embodiment will be omitted. A structure in the second embodiment may be appropriately combined with the structure in the first embodiment.

In the second embodiment, an example in which a look-up table (LUT) is used instead of the distortion compensation efficient will be described.

Example of a Structure

Figure 9:
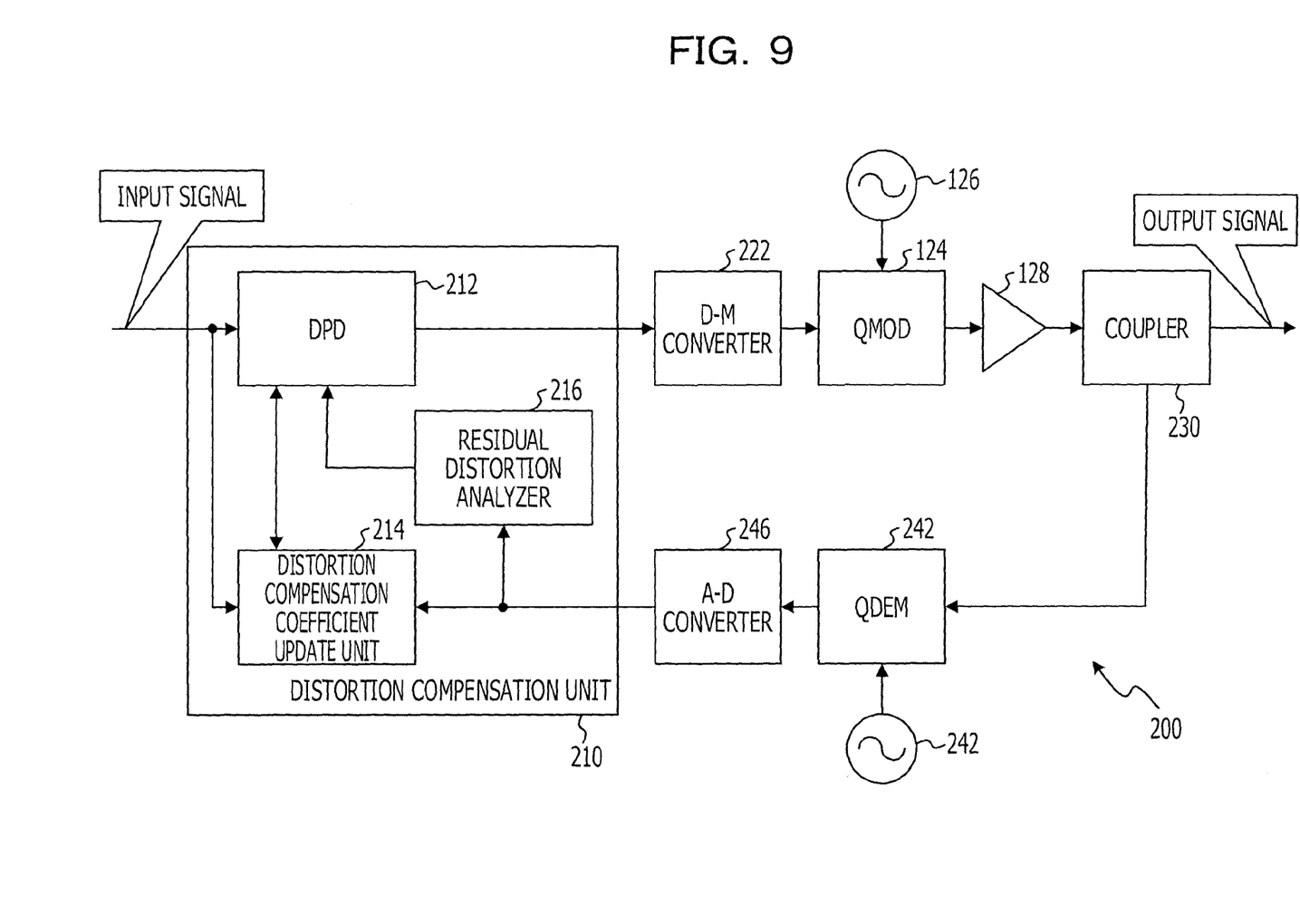
FIG. 9 illustrates an example of the structure of a distortion compensation apparatus in a second embodiment.

FIG. 9 illustrates an example of the structure of a distortion compensation apparatus in the second embodiment. The distortion compensation apparatus 200 includes a distortion compensation unit 210, a D-A converter 222, a QMOD 224, an oscillator 226, an amplifier 228, a coupler 230, a QDEM 242, an oscillator 244, and an A-D converter 246. The distortion compensation unit 210 includes a DPD 212, a LUT update unit 214, and a residual distortion analyzer 216.

When the LUT is used, an expression to obtain a transmission signal (pre-distorted signal) for which non-linear distortion generated by an electric power amplifier is compensated by a general polynomial series expansion equation is represented as follows.

$$PD(t) = \sum_{i=0}^{Delay} \sum_{j=0}^{Delay} \sum_{k=0}^{N} h_{i,j,k}|x(t-j)|^k x(t-i)$$

$$= \sum_{i=0}^{Delay} \sum_{j=0}^{Delay} LUT_i(|x(t-j)|)x(t-i)$$

The DPD 212 performs distortion compensation processing, in which a pre-distorted signal is created, for an input signal according to the LUT, which is updated by the LUT update unit 214, and to information output from the residual distortion analyzer 216.

In the DPD 212, the pre-distorted signal is calculated according to an equation given below.

$$PD(t)=LUT_0(|x(t)|)x(t)+LUT_{i_0}(|x(t-j_0)|)x(t-i_0)$$

Alternatively, the pre-distorted signal may be calculated according to an equation given below.

$$PD(t) = LUT_0(|x(t)|)x(t) + \sum_{i=i_0}^{Delay} \sum_{j=j_0}^{Delay} LUT_i(|x(t-j)|)x(t-i)$$

The LUT update unit 214 creates the LUT and updates it by using an input signal, a pre-distorted signal corresponding to the input signal, and an output signal corresponding to the input signal and pre-distorted signal. The LUT update unit 214 uses the size of the input signal as a search key in creation and update of the LUT for each value of the variable i.

A method of creating and updating the LUT may be, for example, a method based on an LMS algorithm or a method based on an exponentially weighted RLS algorithm. However, an algorithm to be used in the method of creating and updating the LUT is not limited to these algorithms. The LUT is updated at, for example, intervals of a prescribed time. The characteristics of the amplifier 228 may change according to, for example, the aging, working temperature, environment temperature, and input signal. Thus, when the LUT is updated at intervals of a prescribed time, it becomes possible for the LUT to track changes in the characteristics of the amplifier 228.

Hardware Structure

The distortion compensation apparatus 200 in the second embodiment is implemented by a hardware structure similar to the hardware structure of the distortion compensation apparatus 1000 in the first embodiment.

The distortion compensation apparatus 1000 implements the functions of the DPD 212, LUT update unit 214, residual distortion analyzer 216, and the like in the distortion compensation unit 210 by having the processor 1002 execute programs stored in the storage unit 1004.

The LUT created and updated by the LUT update unit 214 is stored in the storage unit 1004.

Effects in the second embodiment

The distortion compensation apparatus 200 in the second embodiment uses the LUT, which is created and updated by the LUT update unit 214, to create a pre-distorted signal. The residual distortion analyzer 216 analyzes residual distortion to select the LUT used in the creation of the pre-distorted signal.

The embodiments described above may be combined as much as possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
an amplifier configured to generate an amplified signal by amplifying a pre-distortion signal, the pre-distortion signal being generated by compensating an input signal for distortion based on a distortion compensation coefficient, the distortion compensation coefficient being determined based on the input signal and the amplified signal; and
a processor configured to:
determine a plurality of amounts of delay based on the amplified signal, the plurality of amounts of delay being used for generating a plurality of delayed signals, each delayed signal being generated by delaying the input signal by each determined amount of delay,
generate the plurality of delayed signals based on the plurality of determined amounts of delay, and
generate the pre-distortion signal by compensating the input signal for distortion further based on the plurality of delayed signals, wherein
the amplified signal includes a carrier signal having a carrier frequency band, an upper side signal having a higher frequency band than the carrier frequency, and a lower side signal having a lower frequency band than the carrier frequency, and
the processor is configured to determine the plurality of amounts of delay based on first residual distortion in the upper side signal and second residual distortion in the lower side signal.

2. The distortion compensation apparatus according to the claim 1, wherein the processor determines the plurality of amounts of delay based on a residual distortion of the amplified signal and a reference value.

3. The distortion compensation apparatus according to the claim 1, wherein the processor is configured to determine the plurality of amounts of delay so that the first residual distortion balances with the second residual distortion.

4. The distortion compensation apparatus according to the claim 1, wherein the processor is configured to determine the plurality of amounts of delay so that a first value balances with a second value, the first value being a difference of the first residual distortion from a first reference value, the second value being a difference of the second residual distortion from a second reference value.

5. A distortion compensation method comprising:
generating an amplified signal by amplifying a pre-distortion signal, the pre-distortion signal being generated by compensating an input signal for distortion based on a distortion compensation coefficient, the distortion compensation coefficient being determined based on the input signal and the amplified signal;
determining a plurality of amounts of delay based on the amplified signal, the plurality of amounts of delay being used for generating a plurality of delayed signals, each delayed signal being generated by delaying the input signal by each determined amount of delay, generating the plurality of delayed signals based on the plurality of determined amounts of delay, and generating the pre-distortion signal by compensating the input signal for distortion further based on the plurality of delayed signals, wherein the amplified signal includes a carrier signal having a carrier frequency band, an upper side signal having a higher frequency band than the carrier frequency, and a lower side signal having a lower frequency band than the carrier frequency, and determining the plurality of amounts of delay based on first residual distortion in the upper side signal and second residual distortion in the lower side signal.

6. The distortion compensation method according to the claim 5, wherein the plurality of amounts of delay are determined based on a residual distortion of the amplified signal and a reference value.

* * * * *